(12) United States Patent
Zhang

(10) Patent No.: US 10,219,410 B2
(45) Date of Patent: Feb. 26, 2019

(54) DEVICE FOR TERMINAL HEAT DISSIPATION AND MOBILE TERMINAL

(71) Applicant: ZTE Corporation, Shenzhen (CN)

(72) Inventor: Yongliang Zhang, Shenzhen (CN)

(73) Assignee: XI'AN ZHONGXING NEW SOFTWARE CO., LTD., Xi'an (CN)

( * ) Notice: Subject to any disclaimer, the term of this patent is extended or adjusted under 35 U.S.C. 154(b) by 0 days.

(21) Appl. No.: 15/504,472

(22) PCT Filed: Nov. 10, 2014

(86) PCT No.: PCT/CN2014/090736
§ 371 (c)(1),
(2) Date: Feb. 16, 2017

(87) PCT Pub. No.: WO2015/117440
PCT Pub. Date: Aug. 13, 2015

(65) Prior Publication Data
US 2017/0238442 A1    Aug. 17, 2017

(30) Foreign Application Priority Data
Aug. 20, 2014 (CN) .......................... 2014 1 0410369

(51) Int. Cl.
*G06F 1/20* (2006.01)
*H05K 7/20* (2006.01)
(Continued)

(52) U.S. Cl.
CPC ....... *H05K 7/20336* (2013.01); *G06F 1/1637* (2013.01); *G06F 1/1656* (2013.01);
(Continued)

(58) Field of Classification Search
CPC .......... H05K 7/20136; H05K 7/20336; H05K 7/2049; H05K 7/2099; H05K 9/006;
(Continued)

(56) References Cited

U.S. PATENT DOCUMENTS 6,250,378 B1 * 6/2001 Kobayashi .......... F28D 15/0266
165/104.33
6,401,805 B1 * 6/2002 Wang .................... H01L 23/427
165/134.1
(Continued)

FOREIGN PATENT DOCUMENTS

CN    1458818 A    11/2003
CN    1552175 A    12/2004
(Continued)

OTHER PUBLICATIONS

International Search Report for corresponding application No. PCT/CN2014/090736 filed on Nov. 10, 2014; dated May 28, 2015.
European Search Reporrt Application Noi. EP14881852.9; dated Jun. 26, 2017; pp. 9.

*Primary Examiner* — Yuwen Pan
*Assistant Examiner* — Paul P Tran
(74) *Attorney, Agent, or Firm* — Cantor Colburn LLP

(57) ABSTRACT

The disclosure discloses a device for terminal heat dissipation and a mobile terminal, including: a heat source chip, a heat pipe, and a shield, wherein the shield is located between the heat source chip and the heat pipe, and is connected with the heat source chip and with the heat pipe via the same type of flexible thermal conductive solid; and a microporous array is arranged at a connection position between the flexible thermal conductive solids, which are in contact with the shield.

18 Claims, 8 Drawing Sheets

(51) Int. Cl.
*H05K 9/00* (2006.01)
*H04W 88/02* (2009.01)
*G06F 1/16* (2006.01)

(52) U.S. Cl.
CPC ............ *G06F 1/1675* (2013.01); *G06F 1/203* (2013.01); *G06F 1/206* (2013.01); *H05K 7/2099* (2013.01); *H05K 9/006* (2013.01); *G06F 2200/201* (2013.01); *H04W 88/02* (2013.01)

(58) Field of Classification Search
CPC ... H05K 9/0084; G06F 1/1616; G06F 1/1624; G06F 1/1632; G06F 1/1637; G06F 1/1675; G06F 1/1681; G06F 1/203; G06F 1/206; G06F 2200/201; G06F 1/1656; F28D 7/0075; F28D 15/0233; F28D 15/0266; F28D 15/0275; F28F 1/24; H04M 1/0274; H04W 88/02
USPC ...... 455/550.1; 165/104.26, 104.33, 185, 45, 165/46; 361/679.47, 679.48, 679.52, 361/679.53, 679.54, 695, 697, 700, 704, 361/720
See application file for complete search history.

(56) References Cited

U.S. PATENT DOCUMENTS

| | | | |
|---|---|---|---|
| 2003/0085050 A1* | 5/2003 | Zarganis | H05K 7/20181 174/383 |
| 2007/0210082 A1* | 9/2007 | English | H05K 9/0032 220/4.21 |
| 2007/0236887 A1* | 10/2007 | Cheng | H01L 23/4006 361/700 |
| 2009/0059517 A1* | 3/2009 | Kim | G06F 1/203 361/679.48 |
| 2009/0091888 A1 | 4/2009 | Lin et al. | |
| 2013/0168058 A1* | 7/2013 | Chamseddine | G06F 1/203 165/104.26 |
| 2014/0092559 A1* | 4/2014 | Yamaguchi | H05K 7/20336 361/700 |
| 2014/0192480 A1* | 7/2014 | Winkler | G06F 1/203 361/679.47 |

FOREIGN PATENT DOCUMENTS

| | | |
|---|---|---|
| CN | 1822758 A | 8/2006 |
| CN | 101395980 A | 3/2009 |
| CN | 102412215 A | 4/2012 |
| CN | 203136420 U | 8/2013 |
| EP | 0721294 A2 | 10/1996 |

* cited by examiner

DEVICE FOR TERMINAL HEAT DISSIPATION AND MOBILE TERMINAL

TECHNICAL FIELD

The disclosure relates to the field of communications, and in particular to a device for terminal heat dissipation and a mobile terminal.

BACKGROUND

A main frequency of a core processor of a smart mobile terminal is growing continuously by 1 GHz, 2 GHz, and dual-core, duad-core and even octa-core have become normal; moreover, a screen of a Liquid Crystal Display (LCD) goes from MD (1920*1080), 2K (2048×1536) to 4K (3840*2160) with resolution and resulting power consumption is increasing. At the same time, the smart mobile terminal has been thin and light to meet user needs so that a heat dissipation problem in a narrow space of a terminal shell is becoming increasingly prominent.

A heat pipe technology adopted in a personal notebook computer has been introduced into the mobile terminal, so that a liquid cooling and heat dissipation technology has begun to emerge in a field of the smart mobile terminal. In smart mobile terminals that have been introduced into a market at present, a shield between a heat source chip and a heat pipe is completely closed, and mainly shields radio frequency signals to prevent a leakage from becoming a air interface interference source. However, due to a separation of the shield, even if the heat source chip is coated with a thermal conductive silicone grease or covered with a compressible solid thermal conductive silicone gasket to be in contact with the shield and an outside of the shield is in close contact with the heat pipe through thermal conductive silicone or silicone grease, since back-and-forth conversion of a conductive medium in a thermal conductive path, and in particular since a closing shield has a poor convection therein, heat from the actual heat source chip still cannot be quickly and to the maximum extent conducted to the heat pipe, and a little more heat will be left in a shielding chamber.

There is no effective solution at present for a problem that heat cannot be quickly conducted to the heat pipe due to the back-and-forth conversion of the conductive medium in the thermal conductive path.

SUMMARY

The embodiments of disclosure provide a device for terminal heat dissipation and a mobile terminal, so as at least to solve the problem that heat cannot be quickly conducted to the heat pipe due to the back-and-forth conversion of the conductive medium in the thermal conductive path.

In an embodiment of the disclosure, a device for terminal heat dissipation is provided, including: a heat source chip, a heat pipe, and a shield, wherein the shield is located between the heat source chip and the heat pipe, and is connected with the heat source chip and with the heat pipe via the same type of flexible thermal conductive solid; and a microporous array is arranged at a connection position between the flexible thermal conductive solids, which are in contact with the shield.

In an example embodiment, the microporous array is used for shielding a radio frequency signal, and a heat of the heat source chip is conducted to the heat pipe via the flexible thermal conductive solid connected with the heat source chip.

In an example embodiment, a signal shielding efficiency of the microporous array is determined by at least one of a pore size of each micropore in the microporous array, a thickness of the shield, a space between two micropores, and a number of the micropores.

In an example embodiment, the pore size of each micropore is less than 1/50 of a wavelength of the radio frequency signal of a shielding area in the shield, the thickness of the shield is 0.2 to 0.3 mm, the space between the two micropores is greater than or equal to 1/4 of the pore size of each micropore and less than or equal to 1/2 of the pore size of each micropore, and the number of the micropores is determined by the shield area corresponding to a surface of the heat source chip.

In an example embodiment, the flexible thermal conductive solid is machined at both sides of the microporous array of the shield without generating voids in each micropore, the flexible thermal conductive solid has a compressibility of 30% to 70% and the flexible thermal conductive solid has a total thickness of 0.5 mm to 1 mm.

In an example embodiment, a shape of each micropore includes at least one of a circle, a triangle, a rectangle, and a rhombus.

In an example embodiment, one end, which is located close to the heat source chip, of the heat pipe is an evaporation area, the other end which is remote from the heat source chip is a condensation area, the condensation area of the heat pipe connected with a metal plate is connected with the metal plate via a flexible thermal conductive solid, and the condensation area of the heat pipe is connected with a support via a flexible thermal conductive solid, wherein the support is connected with a back shell of a terminal via a lining thermal conductive layer.

In an example embodiment, a liquid crystal display (LCD) of the terminal is connected with the metal plate via a elastic and flexible thermal conductive solid of high thermal conductivity, wherein the high thermal conductivity refers to a thermal conductivity greater than 100.

In an example embodiment, the device further includes: a graphite thermal conductive area provided in a heat generating area of a Light Emitting Diode (LED) of the LCD screen.

In an example embodiment, the liner thermal conductive layer includes one of a graphite layer and a copper foil.

In an example embodiment, the back shell is provided with micropores.

In an example embodiment, an evaporation area of the heat pipe is arranged to pass through a metal plate connected with the heat pipe and connect with a heat generating area of an LED of an LCD via a flexible thermal conductive solid; a screen of the LCD is arranged to connect with the metal plate via a flexible thermal conductive solid of high thermal conductivity, wherein the high thermal conductivity refers to a thermal conductivity greater than 100.

In an example embodiment, the device further includes: a heat pipe, arranged in a heat generating area of an LED of an LCD of a terminal.

In another embodiment of the disclosure, a mobile terminal is also provided, including above-mentioned device.

By means of the embodiment of the disclosure, a terminal heat dissipation device is provided, including: a heat source chip, a heat pipe, and a shield, wherein the shield is located between the heat source chip and the heat pipe, and is connected with the heat source chip and with the heat pipe via the same type of flexible thermal conductive solid; and a microporous array is arranged at a connection position between the flexible thermal conductive solids, which are in contact with the shield, so that the problem that heat cannot be quickly conducted to the heat pipe due to the back-and-forth conversion of the conductive medium in the thermal conductive path is solved, and heat can therefore be quickly conducted to the heat pipe, speeding up an effect of heat dissipation.

BRIEF DESCRIPTION OF THE DRAWINGS

The drawings are described here to provide further understanding of the disclosure, and form a part of the disclosure. The schematic embodiments and description of the disclosure are adopted to explain the disclosure, and do not form improper limits to the disclosure. In the drawings.

DETAILED DESCRIPTION

The disclosure is described below with reference to the drawings and the embodiments in detail. It is important to note that the embodiments of the disclosure and the characteristics in the embodiments can be combined under the condition of no conflicts.

Figure 1:
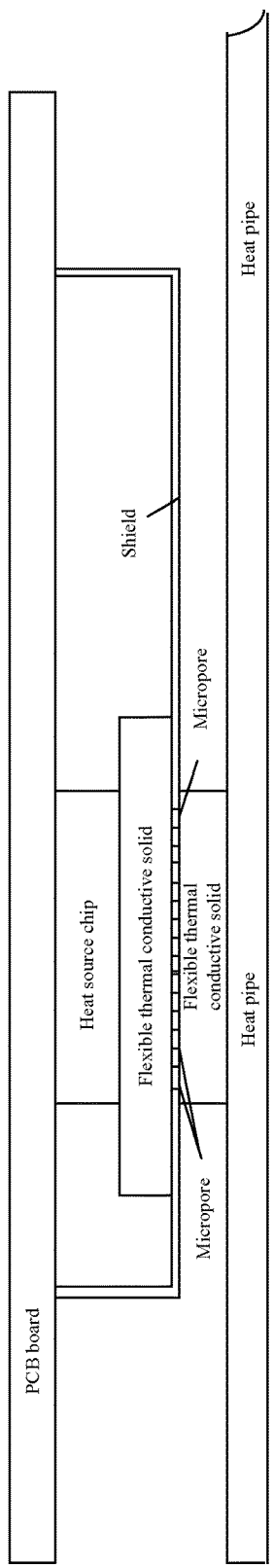
FIG. 1 is a schematic diagram of a device for terminal heat dissipation according to an embodiment of the disclosure.

One embodiment of the disclosure provides a device for terminal heat dissipation. FIG. 1 is a schematic diagram of a device for terminal heat dissipation according to an embodiment of the disclosure. As shown in FIG. 1, the device includes a heat source chip, a heat pipe, and a shield, wherein the shield is located between the heat source chip and the heat pipe, and is connected with the heat source chip and with the heat pipe via the same type of flexible thermal conductive solid; and a microporous array is arranged at a connection position between the flexible thermal conductive solids, which are in contact with the shield.

In an example embodiment, the microporous array shields a radio frequency signal, and a heat of the heat source chip is conducted to the heat pipe via the flexible thermal conductive solid connected with the heat source chip.

In an example embodiment, a signal shielding efficiency of the microporous array is determined by at least one of a pore size of each micropores in the microporous array, a thickness of the shield, a space between two micropores, and a number of the micropores. Moreover, the pore size of each micropore is less than $1/50$ of a wavelength of the radio frequency signal of a shielding area in the shield, the thickness of the shield is 0.2 to 0.3 mm, the space between the two micropores is greater than or equal to $1/4$ of the pore size of each micropore and less than or equal to $1/2$ of the pore size of each micropore, and the number of the micropores is determined by the shield area corresponding to a surface of the heat source chip, i.e., within the maximum allowable value of the shield area corresponding to the surface of the heat source chip. It is also possible to limit the number of micropores to $1/2$ of the wavelength of the radius of the circular area, but it must be within the maximum value of the shield area corresponding to the surface of the heat source chip. A bigger space between the two micropores is better from a perspective of a shielding efficiency. However, in order to ensure the thermal conductivity of the flexible thermal conductive solid in the area of the microporous array, it is necessary to limit the space to be equal to or slightly smaller than the radius of each micropore, and specifically to limit the space between the two micropores to be greater than or equal to $1/4$ of the pore size of each micropore and less than or equal to $1/2$ of the pore size of each micropore to ensure that a total shielding efficiency is more than 30 dB/1 GHz.

In an example embodiment, the flexible thermal conductive solid is machined at both sides of the microporous array of the shield without generating voids in each micropore, the flexible thermal conductive solid has a compressibility of 30% to 70% and the flexible thermal conductive solid has a total thickness of 0.5 mm to 1 mm.

In an example embodiment, a shape of each micropore includes at least one of a circle, a triangle, a rectangle, and a rhombus, and other embodiments that can achieve the same effect fall within the scope of protection of the disclosure.

Figure 2:
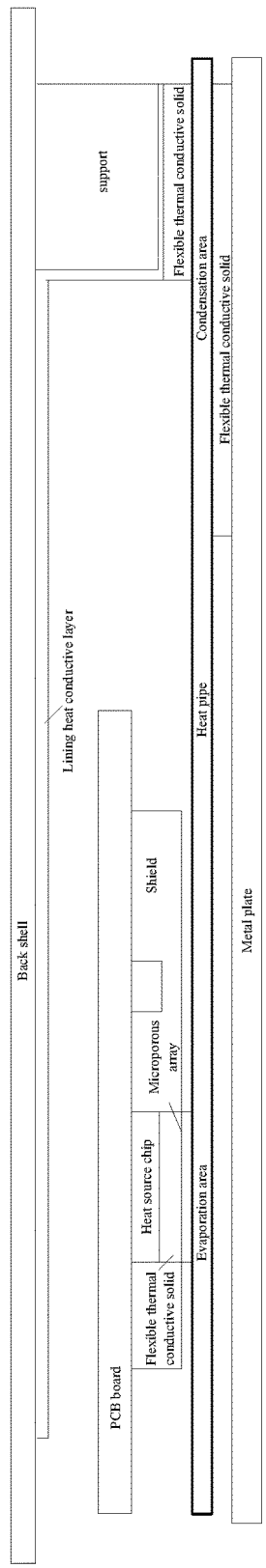
FIG. 2 is a schematic diagram of a device for terminal heat dissipation according to a first example embodiment of the disclosure.

FIG. 2 is a schematic diagram of a device for terminal heat dissipation according to a first example embodiment of the disclosure. As shown in FIG. 2, the device further includes that: one end, which is located close to the heat source chip, of the heat pipe is an evaporation area, the other end which is remote from the heat source chip is a condensation area, the condensation area of the heat pipe connected with a metal plate is connected with the metal plate via a flexible thermal conductive solid, and the condensation area of the heat pipe is connected with a support via a flexible thermal conductive solid, moreover the support is connected with a back shell of a terminal via a lining thermal conductive layer.

Figure 3:
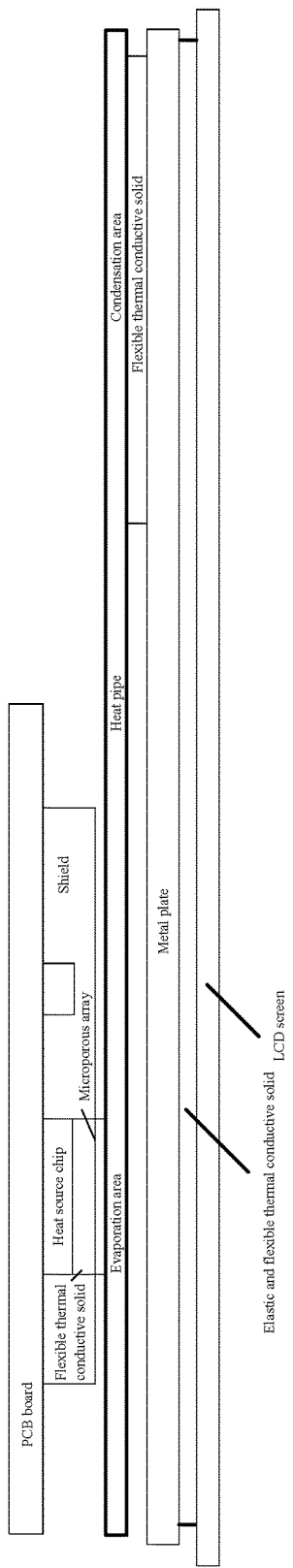
FIG. 3 is a schematic diagram of a device for terminal heat dissipation according to a second example embodiment of the disclosure.

FIG. 3 is a schematic diagram of a device for terminal heat dissipation according to a second example embodiment of the disclosure. As shown in FIG. 3, a LCD of the terminal is connected with the metal plate via a elastic and flexible thermal conductive solid of high thermal conductivity, wherein the high thermal conductivity refers to a thermal conductivity greater than 100.

Figure 4:
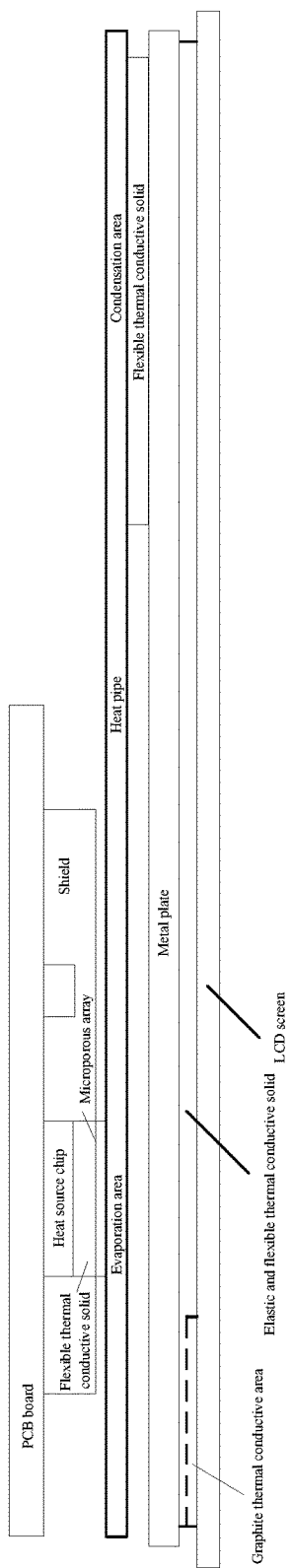
FIG. 4 is a schematic diagram of a device for terminal heat dissipation according to a third example embodiment of the disclosure.

FIG. 4 is a schematic diagram of a device for terminal heat dissipation according to a third example embodiment of the disclosure. As shown in FIG. 4, the device further includes that: a graphite thermal conductive area, which is arranged in a heat generating area of a Light Emitting Diode (LED) of a screen of the LCD.

In an example embodiment, the liner thermal conductive layer includes one of a graphite layer and a copper foil. As an example embodiment, the back shell of the terminal is provided with micropores, the back shell surface faces directly atmosphere, and the micropores of the back shell allow the heat of the lining thermal conductive layer to be directly exchanged with the atmosphere. Compared with the heat of the heat pipe only conducted to a steel plate or magnesium alloy plate, an thermal conductive effect is further enhanced.

Figure 5:
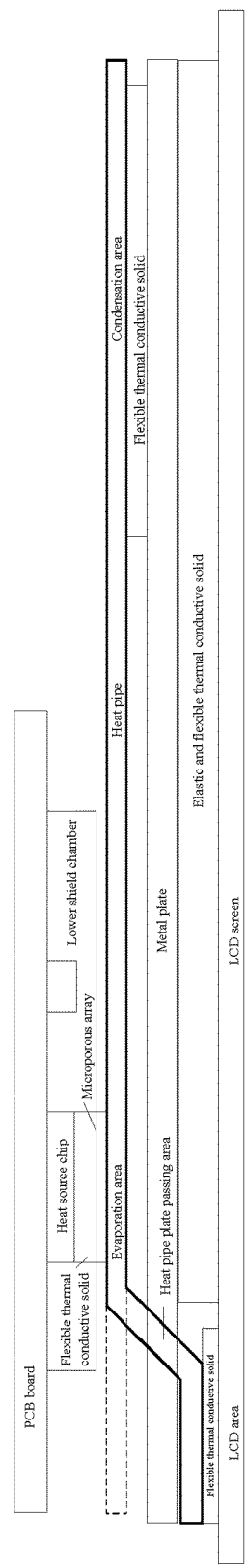
FIG. 5 is a schematic diagram of a device for terminal heat dissipation according to a fourth example embodiment of the disclosure.

FIG. 5 is a schematic diagram of a device for terminal heat dissipation according to a fourth example embodiment of the disclosure. As shown in FIG. 5, an evaporation area of the heat pipe is arranged to pass through a metal plate connected with the heat pipe and connect with a heat generating area of an LED of an LCD via a flexible thermal conductive solid; a screen of the LCD is arranged to connect with the metal plate via a flexible thermal conductive solid of high thermal conductivity, wherein the high thermal conductivity refers to a thermal conductivity greater than 100.

In an example embodiment, a heat pipe may be further arranged in a heat generating area of an LED of an LCD of a terminal.

In another embodiment of the disclosure, there is also provided a mobile terminal including above-mentioned device.

Hereinafter, the embodiments of the disclosure will be described with reference to example embodiments.

The mobile terminal in the embodiments of the disclosure is integrated with the device for heat dissipation, focusing on improving heat pipe utilization efficiency, the back shell lining heat dissipation layer, LCD uniform heat dissipation and the like. By arraying the microporous array evenly across the shield corresponding to a position of the heat source chip, the array ensures that a radio frequency model will not produce leakage and radio frequency shielding performance is ensured, and then a compressible solid thermal conductive silicone gasket or a coated thermal conductive silicone grease can be machined at both sides of the microporous array. The evaporation area of the heat pipe is placed above the heat source chip, so that the heat energy generated by the heat source chip can be quickly and directly conducted to the heat pipe. And then liquid in the evaporation area of the heat pipe is quickly conducted to the condensation area.

In an example embodiment, based on a close contact between a single side of the condensation area of the heat pipe and a steel plate or a magnesium alloy supported by the mobile terminal, the other side is in close contact with a light back shell lining heat dissipation layer mainly composed of a graphite film and a copper foil; and both sides of the heat pipe are provided with the thermal conductive silicone gasket or the thermal conductive silicone grease. In this way, the heat in the condensation area of the heat pipe is conducted and emitted in many directions so that the liquid vapor in the heat pipe is liquefied quickly and flows back to the evaporation area through a capillary layer attached inside the heat pipe so as to further reciprocate the thermal cycle.

For LCD heat dissipation treatment, the steel plate or the magnalium plate supported by the evaporation area of the heat pipe is in close contact with LED heat generating area of the LCD so that the heat in the LED area is quickly conducted by the heat pipe. The heat pipe and LED area have the thermal conductive silicone gasket or the thermal conductive silicone grease. At the same time, the flexible thermal conductive material of high thermal conductivity is filled between the LCD and a supporting steel plate or magnesium alloy for auxiliary heat dissipation and reducing the LCD "water ripple" phenomenon.

When it is difficult for a structure design to pass through the supporting steel plate or magnalium plate, an LCD area covering the LED is increased. A flexible solid thermal conductive material of high thermal conductivity is filled between the LCD and the supporting steel plate or magnesium alloy (optionally, the graphite thermal conductive layer covers the local area outside the LCD area) for an effective heat dissipation of the LCD and improving a structural water ripple.

Meanwhile, according to the above-described method, the embodiment of the disclosure constructs the corresponding mobile terminal device.

Example embodiments of the disclosure will now be described in detail with reference to specific embodiments.

NEC and SONY from Japan take a lead in use of heat pipe technology in the mobile terminal (in order to meet requirements of a thickness of mobile phones, the heat pipe is flattened and controlled to have a thickness of 0.4 mm). The heat pipe is a technology developed in 1980's, in which a thermal conductance is enhanced by thousands of times when compared with a copper. An inner wall of the heat pipe is lined with porous material, which is called an absorption core which is full of alcohol or other easily vaporized liquid. When one end of the heat pipe is heated, liquid in a absorption core at this end is vaporized due to absorption of heat (the evaporation area). The steam runs from one heated end to the other end through the air channel in the middle of the heat pipe along the pipe. Since the other end is heated, and has a low temperature, the steam discharges heat and is liquified at this end (the condensation area). Condensed liquid is adsorbed by a absorption core of a capillary structure attached inside a wall of the heat pipe and returns to a heated end through a capillary action. Reciprocating in such way, liquid in the heat pipe continues to vaporize and liquify, the heat is conducted from one end to the other end.

Figure 6:
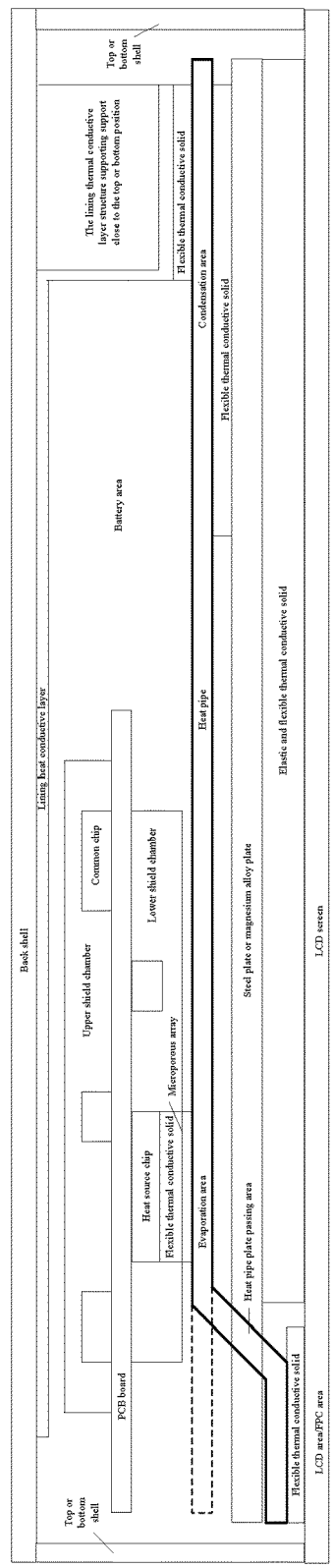
FIG. 6 is an overall schematic diagram of a device for terminal heat dissipation according to an example embodiment of the disclosure.

FIG. 6 is an overall schematic diagram of a device for terminal heat dissipation according to an example embodiment of the disclosure. As shown in FIG. 6 and in the overall schematic diagram of the device for heat dissipation of the mobile terminal of the disclosure, a bear shell and a top or bottom shell of the screen of the LCD together form a frame of the mobile terminal, in which a supporting steel plate and a magnesium alloy plate are provided. A Printed Circuit Board (PCB) and a battery area (the proportion of the figure is small because the battery is not a focus of the disclosure) are provided on the supporting plate. The PCB has a double-sided layout. The double-sided metal shield forms an upper shielding chamber and a lower shielding chamber (there may be multiple chambers in fact, but an upper shielding chamber and a lower shielding chamber are shown in the figure). A heat source chip (usually including a main chip, a power chip, a radio frequency power amplifier and the like of a central processing unit, but only a single example is shown in the figure) is arranged on the lower shielding chamber. A heat pipe of a elongated flat oval interface is placed out of the lower shielding chamber. The heat pipe is not necessarily straight. According to a layout position of the heat source chip, the heat pipe evaporation area passes directly above a plurality of heat source chips, and can moderately bend forward to absorb heat energy of each heat source chip.

In NEC and SONY smart mobile terminals which have been introduced into the market at present, the shield between the heat source chip and the heat pipe is completely closed, and mainly shields the radio frequency signal to prevent the leakage from becoming the air interface interference source. However, due to the separation of the shield, even if the heat source chip is coated with a thermal conductive silicone grease or covered with a compressible solid thermal conductive silicone gasket (i.e., the flexible thermal conductive solid in FIG. 6) to be in contact with the shield and an outside of the shield is in close contact with the heat pipe through the thermal conductive silicone or silicone grease, since a back-and-forth conversion of a conductive medium in a thermal conductive path, and in particular since the closing shield has a poor convection therein, the heat from the actual heat source chip still cannot be quickly and to the maximum extent conducted to the heat pipe, and a little more heat will be left in the shielding chamber in a comparative sense.

Figure 7:
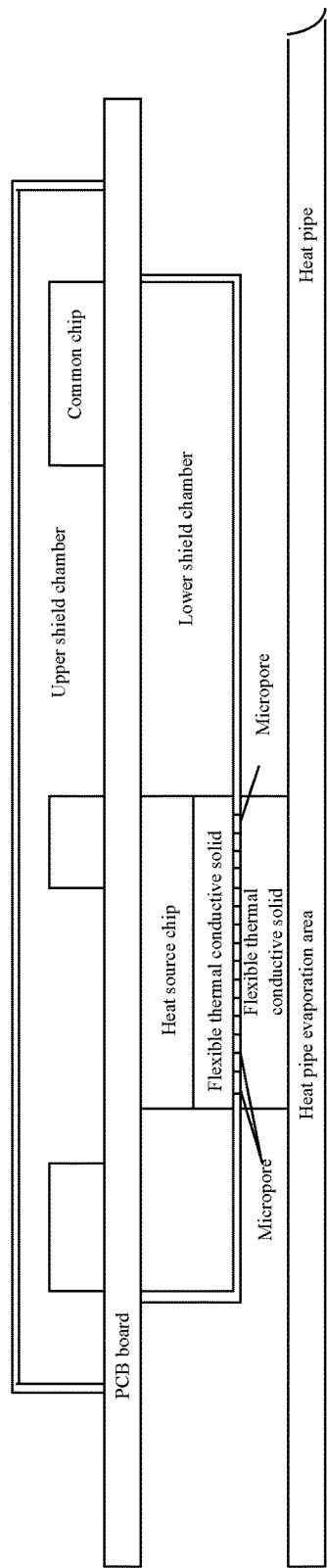
FIG. 7 is a schematic cross-sectional diagram of a heat source device shield opening and a thermal conductive material filling of a device for terminal heat dissipation according to an example embodiment of the disclosure.
Figure 8:
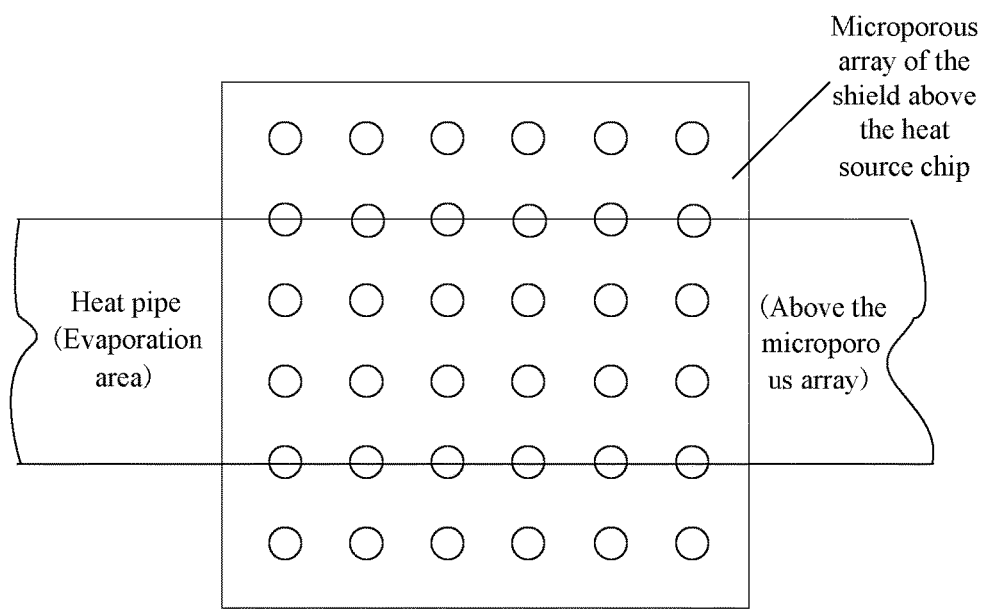
FIG. 8 is a top diagram of a heat source device shield microporous array of a mobile terminal of a device for terminal heat dissipation according to an example embodiment of the disclosure.

FIG. 7 is a schematic cross-sectional diagram of a heat source device shield opening and a thermal conductive material filling of a device for terminal heat dissipation according to an example embodiment of the disclosure, and FIG. 8 is a top diagram of a heat source device shield microporous array of a mobile terminal of a device for terminal heat dissipation according to an example embodiment of the disclosure. As shown in FIG. 7 and FIG. 8, the embodiments of the disclosure open a regular microporous array in a shield area facing directly above the heat source chip. The microporous array needs to meet both requirements of a shielding efficiency of a radio frequency signal and a conductive property of a flexible thermal conductive solid medium.

1) A Shielding Efficiency of the Microporous Array

A shielding efficiency (SE) of the microporous array is determined by the pore size, the thickness of the shield, and the number of micropores in unit of decibels.

$$SE = 20[\log \lambda/(2L)] + [30\ t/L] - [10 \log n] \quad \text{(Formula 1);}$$

in which L is a length of an open area (the micropores may be square, rectangular, triangular, rhombus pores, and may be a diameter of round holes), and L is much larger than the thickness t of the shield, $\lambda$ is a wavelength, and n is the number of micropores (within a circular area limited by a $\lambda/2$ radius).

The aperture is deduced from $20\,[\log \lambda/(2L)]$, and it is required to be less than 1/50 of the wavelength of the radio frequency signal of the shielding area.

From the thickness of the shield [30 t/L], it can be seen that the thickness is proportional to the shielding effect, since the thickness of 0.2 to 0.4 mm should be left at both sides of the micropores of the shield to fill the flexible thermal conductive solid, and the thermal conductivity will be severely reduced if the thermal conductive silicone of the usual flexible thermal conductive solid material is more than 1 mm, the thickness of the shield should be 0.2 to 0.3 mm.

From the number of micropores [10 log n], it can be seen that the more the number is, the poorer the shielding efficiency is. The number of micropores is limited to ½ of the wavelength of the radius of the circular area, and within the maximum allowable value of the shield area corresponding to the surface of the heat source chip, the spacing of micropores is equal to or slightly smaller than the radius of the micropores (the bigger spacing of the micropores is better from the perspective of the shielding efficiency. However, in order to ensure the thermal conductivity of the flexible thermal conductive solid in the area of the microporous array, it is necessary to limit the spacing of micropores to be within the range equal to or slightly smaller than the radius of the micropores) to ensure that a total shielding efficiency is more than 30 dB/1 GHz.

Generally, the surface area of the heat source device of the mobile terminal is much smaller than area of the circular area of the ½ of wavelength of the radius of the radio frequency to be shielded, so that the number of micropores in the shield area corresponding to the surface of the heat source device may be designed according to the maximum allowable value in the case that the spacing of micropores is equal to or slightly less than the radius of micropores.

2) The Flexible Thermal Conductive Solid

The flexible thermal conductive solid is machined at both sides of the microporous array of the shield without generating voids in the micropores, the solid material has a compressibility of 30% to 70% and a total thickness of 0.6 mm to 1 mm (the thickness of the shield therebetween is from 0.2 mm to 0.3 mm, and the thickness at both sides of micropores of the shield is from 0.2 to 0.4 mm). For the flexible thermal conductive material commonly used here at present, the thermal conductive silicone is most commonly used. The product which is cheap and has a thermal conductivity of 1 to 5 W/m·K and furthermore 5 W/m·K is better. But it cannot be too thick, and if it is more than 1 mm, the flexible thermal conductive solid property will be severely reduced and the thermal resistance is very high; at the same time, it cannot be too thin, and if it is too thin, the shield will be inevitably required to be further thinned. The thinned shield will result in a significant reduction in the shielding efficiency.

The microporous array does not form a dielectric barrier. In the case that the same kind of flexible thermal conductive solid media is used in the area of the upper and lower sides of the microporous array of the shield, most of the heat of the heat source chip can be transmitted to the heat pipe via only one medium. In this way, the problem that the heat cannot be effectively conducted in a timely manner at the first time due to the back-and-forth conversion of the transmission medium in the thermal transmission path and the lack of heat convection for the closed shield can be avoided. In the aspect of the process assembly, the flexible thermal conductive solid is first processed to the shield, and then covers the shield above the heat source device. Furthermore, based on a close contact between a single side of the condensation area of the heat pipe and the steel plate or the magnesium alloy supported by the mobile terminal, according to the embodiments of the disclosure, it is achieved in the condensation area of the heat pipe in a targeted way that the heat pipe is in close contact with a light back shell lining heat dissipation layer mainly composed of a graphite film and a copper foil (in the part against the heat pipe, it needs the support from the local structure support to press the back shell lining heat dissipation layer to the heat pipe) in a manner of supporting by the local structure support to press the back shell lining heat dissipation layer to the heat pipe; and both sides of the heat pipe are provided with the thermal conductive silicone gasket or the thermal conductive silicone grease. In this way, the heat in the condensation area of the heat pipe is conducted and emitted in many directions so that the liquid vapor in the heat pipe is liquefied quickly and flows back to the evaporation area through the capillary layer attached inside the heat pipe so as to further reciprocate the thermal cycle and continuously conduct the heat energy of the heat source.

It should be noted that a large area of the lining thermal conductive layer is attached to the back shell and extended above the PCB board. While pressing to the condensation area of the heat pipe through the support to receive heat energy of the heat pipe, it also directly receives the convection and radiation heat energy generated by the area from the direction of the back shell of the PCB board. In addition, there is often more than one PCB heat source device, so a number of heat source devices are placed on the evaporation area path of the heat pipe as far as possible in the layout to achieve the rapid thermal conductivity of a single heat pipe (heat pipe has a high cost); really because the large or narrow PCB area leads to the layout dispersion of the heat source device, the problem of heat dissipation may be solved in a manner of increasing heat pipes.

For the mobile terminal, in addition to the thermal dissipation of the heat source devices (a main chip, a power chip, a radio frequency power amplifier and the like of the central processing unit) on the PCB, the screen of the LCD goes from FHD (1920*1080), 2K (2048×1536) to 4K (3840*2160) with the resolution, and the resulting heat dissipation cannot be underestimated. The heat dissipation of the LCD has a main source from a top backlight LED of the LCD. The LED area is also the area of the FPC (Floppy Printed Circuit) attached to the control chip of the LCD. In order to effectively reduce the heat in the LED area of the LCD, based on the fact that the mobile terminal uses heat pipes for heat dissipation, the heat pipe evaporation area passes through the supporting steel plate and magnalium area in the process, and then is close to the LED area (the thermal conductive silicone or silicone grease is filled therebetween), so that the heat from the LED area may be directly conducted to the heat pipe and then quickly passed to the condensation area through the heat pipe for circulating heat. As a large area of the LCD outside the LED will also generate a certain heat, the flexible thermal conductive material of high thermal conductivity is filled between the LCD and the supporting steel plate or magnesium alloy for further heat dissipation.

The disclosure provides an embodiment of the flexible thermal conductive material of high thermal conductivity: omnidirectional conductive foam. The omnidirectional conductive foam is uniformly doped with copper powder, aluminum powder and nickel powder based on the ordinary foam, and has a low cost and a good electrical conductivity itself; in the case of appropriate external extrusion, it has the performance of good conductivity in all directions are (good grounding performance); but this conductivity also shows a good thermal conductivity. On the one hand, the doped metal components have a relatively high thermal conductivity, while on the other hand, the compressibility of the high thermal conductivity of the foam may achieve a good comprehensive surface contact, so that the heat source may fully conduct heat. The use of this foam may not only achieve effective grounding and heat reduction, but also has a prominent feature that the "water ripple" phenomenon of the LCD surface formed by the uneven supporting degree due to the suspension of the back of the LCD can be effectively reduced, effectively enhancing the structural reliability and user experience performance.

When it is difficult for the structural design to pass through the supporting steel plate or magnalium plate (the heat pipe evaporation end may be only in the dotted line position in FIG. 6), on the one hand, a separate heat pipe can be added to the LED area of the LCD, the heat pipe evaporation area is close to the LED area, and the condensation area and the previous heat pipe may not be in the same fixed area, but the heat treatment methods in the condensing area are similar; while on the other hand, as shown in the diagram of LCD screen thermal conductivity options in FIG. 4, the flexible thermal conductive material of high thermal conductivity filled between the LCD and the supporting steel plate or magnesium alloy increases the coverage area to the LED/FPC area of the LCD, and optionally covers the graphite conductive layer in the local coverage outside the LED/FPC area (dashed line in FIG. 4, the good thermal conductivity of X axis and Y axis of the graphite film may quickly spread the heat of the LED area evenly, and at the same time, the PET film on its surface may prevent the metal dust of some flexible thermal conductive materials of high thermal conductivity from intruding into the LED/FPC circuit sensitive area) for effective heat dissipation of the LCD. Similarly, the appropriate filling of the flexible thermal conductive material of high thermal conductivity may improve the "water ripple" phenomenon of the LCD surface in this case.

Based on the above method, the embodiments of the disclosure further construct the corresponding mobile terminal device.

The above are only the example embodiments of the disclosure and not intended to limit the disclosure, and for the skilled person in the art, the disclosure can have various modifications and variations. Any modifications, equivalent replacements, improvements and the like within the spirit and principle of the disclosure shall fall within the scope of protection of the disclosure.

INDUSTRIAL APPLICABILITY

The technical solution provided by the embodiments of the disclosure can be applied to the field of communications, and solves the problem that heat cannot be quickly conducted to the heat pipe due to the back-and-forth conversion of the conductive medium in the thermal conductive path, and heat can therefore be quickly conducted to the heat pipe, speeding up an effect of heat dissipation.

What is claimed is:

1. A device for terminal heat dissipation, comprising: a heat source chip, a heat pipe, and a shield, wherein the shield is located between the heat source chip and the heat pipe, and is connected with the heat source chip and with the heat pipe via the same type of flexible thermal conductive solid; and a microporous array is arranged at a connection position between the flexible thermal conductive solids, which are in contact with the shield;
   wherein a pore size of each micropore is less than 1/50 of a wavelength of the radio frequency signal of a shielding area in the shield, a thickness of the shield is 0.2 to 0.3 mm, a space between two micropores is greater than or equal to 1/4 of the pore size of each micropore and less than or equal to 1/2 of the pore size of each micropore, and a number of the micropores is determined by the shield area corresponding to a surface of the heat source chip.

2. The device as claimed in claim 1, wherein the microporous array is used for shielding a radio frequency signal, and a heat of the heat source chip is conducted to the heat pipe via the flexible thermal conductive solid connected with the heat source chip.

3. The device as claimed in claim 2, wherein
   a signal shielding efficiency of the microporous array is determined by at least one of the pore size of each micropore in the microporous array, the thickness of the shield, the space between two micropores, and the number of the micropores.

4. The device as claimed in claim 2, wherein
   the flexible thermal conductive solid is machined at both sides of the microporous array of the shield without generating voids in each micropore, the flexible thermal conductive solid has a compressibility of 30% to 70% and the flexible thermal conductive solid has a total thickness of 0.5 mm to 1 mm.

5. The device as claimed in claim 1, wherein a shape of each micropore comprises at least one of a circle, a triangle, a rectangle, and a rhombus.

6. The device as claimed in claim 1, wherein one end, which is located close to the heat source chip, of the heat pipe is an evaporation area, the other end which is remote from the heat source chip is a condensation area, the condensation area of the heat pipe connected with a metal plate is connected with the metal plate via a flexible thermal conductive solid, and the condensation area of the heat pipe is connected with a support via a flexible thermal conductive solid, wherein the support is connected with a back shell of a terminal via a lining thermal conductive layer.

7. The device as claimed in claim 6, wherein
a liquid crystal display (LCD) of the terminal is connected with the metal plate via a elastic and flexible thermal conductive solid of high thermal conductivity, wherein the high thermal conductivity refers to a thermal conductivity greater than 100.

8. The device as claimed in claim 7, wherein the device further comprises:
a graphite thermal conductive area provided in a heat generating area of a Light Emitting Diode (LED) of the LCD screen.

9. The device as claimed in claim 6, wherein the liner thermal conductive layer comprises one of a graphite layer and a copper foil.

10. The device as claimed in claim 6, wherein the back shell is provided with micropores.

11. The device as claimed in claim 1, wherein
an evaporation area of the heat pipe is arranged to pass through a metal plate connected with the heat pipe and connect with a heat generating area of an LED of an LCD via a flexible thermal conductive solid;
a screen of the LCD is arranged to connect with the metal plate via a flexible thermal conductive solid of high thermal conductivity, wherein the high thermal conductivity refers to a thermal conductivity greater than 100.

12. The device as claimed in claim 1, wherein the device further comprises: a heat pipe, arranged in a heat generating area of an LED of an LCD of a terminal.

13. A mobile terminal comprising a device for terminal heat dissipation, wherein the device comprising: a heat source chip, a heat pipe, and a shield, wherein the shield is located between the heat source chip and the heat pipe, and is connected with the heat source chip and with the heat pipe via the same type of flexible thermal conductive solid; and a microporous array is arranged at a connection position between the flexible thermal conductive solids, which are in contact with the shield;
wherein a pore size of each micropore is less than 1/50 of a wavelength of the radio frequency signal of a shielding area in the shield, a thickness of the shield is 0.2 to 0.3 mm, a space between two micropores is greater than or equal to 1/4 of the pore size of each micropore and less than or equal to 1/2 of the pore size of each micropore, and a number of the micropores is determined by the shield area corresponding to a surface of the heat source chip.

14. The mobile terminal as claimed in claim 13, wherein the microporous array is used for shielding a radio frequency signal, and a heat of the heat source chip is conducted to the heat pipe via the flexible thermal conductive solid connected with the heat source chip.

15. The mobile terminal as claimed in claim 14, wherein a signal shielding efficiency of the microporous array is determined by at least one of the pore size of each micropore in the microporous array, the thickness of the shield, the space between two micropores, and the number of the micropores.

16. The mobile terminal as claimed in claim 13, wherein one end, which is located close to the heat source chip, of the heat pipe is an evaporation area, the other end which is remote from the heat source chip is a condensation area, the condensation area of the heat pipe connected with a metal plate is connected with the metal plate via a flexible thermal conductive solid, and the condensation area of the heat pipe is connected with a support via a flexible thermal conductive solid, wherein the support is connected with a back shell of a terminal via a lining thermal conductive layer.

17. The mobile terminal as claimed in claim 16, wherein a liquid crystal display (LCD) of the terminal is connected with the metal plate via a elastic and flexible thermal conductive solid of high thermal conductivity, wherein the high thermal conductivity refers to a thermal conductivity greater than 100.

18. The mobile terminal as claimed in claim 13, wherein an evaporation area of the heat pipe is arranged to pass through a metal plate connected with the heat pipe and connect with a heat generating area of an LED of an LCD via a flexible thermal conductive solid; a screen of the LCD is arranged to connect with the metal plate via a flexible thermal conductive solid of high thermal conductivity, wherein the high thermal conductivity refers to a thermal conductivity greater than 100.

* * * * *